United States Patent
Takeda

(10) Patent No.: US 12,111,367 B2
(45) Date of Patent: Oct. 8, 2024

(54) CABLE ABNORMALITY ASSESSMENT SYSTEM, SLAVE DEVICE, AND CABLE ABNORMALITY ASSESSMENT METHOD

(71) Applicant: OMRON Corporation, Kyoto (JP)

(72) Inventor: Takashi Takeda, Kyoto (JP)

(73) Assignee: OMRON Corporation, Kyoto (JP)

( * ) Notice: Subject to any disclaimer, the term of this patent is extended or adjusted under 35 U.S.C. 154(b) by 189 days.

(21) Appl. No.: 17/797,728

(22) PCT Filed: Feb. 9, 2021

(86) PCT No.: PCT/JP2021/004834
§ 371 (c)(1),
(2) Date: Aug. 5, 2022

(87) PCT Pub. No.: WO2021/176972
PCT Pub. Date: Sep. 10, 2021

(65) Prior Publication Data
US 2023/0064446 A1    Mar. 2, 2023

(30) Foreign Application Priority Data

Mar. 6, 2020   (JP) ................................. 2020-039396

(51) Int. Cl.
*G01R 31/58*   (2020.01)
*H04L 25/02*   (2006.01)

(52) U.S. Cl.
CPC .............. *G01R 31/58* (2020.01); *H04L 25/02* (2013.01)

(58) Field of Classification Search
CPC ......... G01R 31/58; H04L 25/02; H04L 67/12; H04L 69/40; H04B 3/46; G05B 23/0256; G05B 19/042
(Continued)

(56) References Cited

U.S. PATENT DOCUMENTS

| 2010/0164505 A1* | 7/2010 | Breed ................. G01R 31/58 324/533 |
| 2010/0180350 A1 | 7/2010 | Glaubert |

(Continued)

FOREIGN PATENT DOCUMENTS

| JP | S6067808 | 4/1985 |
| JP | S63304727 | 12/1988 |

(Continued)

OTHER PUBLICATIONS

"International Search Report (Form PCT/ISA/210) of PCT/JP2021/004834," mailed on May 11, 2021, with English translation thereof, pp. 1-4.

(Continued)

*Primary Examiner* — Tung X Nguyen
*Assistant Examiner* — Robert P Alejnikov, Jr.
(74) *Attorney, Agent, or Firm* — JCIPRNET

(57) ABSTRACT

The invention provides a cable abnormality assessment system, a slave device, and a cable abnormality assessment method. A cable abnormality assessment system is provided with a diagnosis control unit for assessing a cable abnormality on the basis of link-up information between a communication unit and another machine connected to the other end of a cable, and first and second information that are the respective results of abnormality diagnosis by a signal line diagnosis unit with regard to one and the other of two pair signal lines of the cable.

8 Claims, 4 Drawing Sheets

| Status of pair signal line | The other machine | Reception wave | Result of abnormality diagnosis |
|---|---|---|---|
| Normal | On | Fast link pulse | Undiagnosable |
| | Off | No reception wave | Normal |
| Short-circuited | On | Negative reflection wave | Short-circuited |
| | Off | | |
| Disconnected | On | Positive reflection wave | Disconnected |
| | Off | | |

(58) Field of Classification Search
USPC .......................................................... 324/543
See application file for complete search history.

(56) References Cited

U.S. PATENT DOCUMENTS

2017/0034507 A1* 2/2017 Harris ...................... H04B 3/46
2018/0034568 A1   2/2018 Kuo

FOREIGN PATENT DOCUMENTS

| | | | |
|---|---|---|---|
| JP | 2003188928 | | 7/2003 |
| JP | 2003188928 A | * | 7/2003 |
| JP | 2013236162 | | 11/2013 |
| JP | 2014171025 | | 9/2014 |
| JP | 2014171025 A | * | 9/2014 |
| JP | 2015220547 | | 12/2015 |
| JP | 2015220547 A | * | 12/2015 |
| WO | 2020235181 | | 11/2020 |

OTHER PUBLICATIONS

"Written Opinion of the International Searching Authority (Form PCT/ISA/237)" of PCT/JP2021/004834, mailed on May 11, 2021, with English translation thereof, pp. 1-8.
"Search Report of Europe Counterpart Application", issued on Feb. 27, 2024, pp. 1-9.

* cited by examiner

| Status of pair signal line | The other machine | Reception wave | Result of abnormality diagnosis |
|---|---|---|---|
| Normal | On | Fast link pulse | Undiagnosable |
| | Off | No reception wave | Normal |
| Short-circuited | On | Negative reflection wave | Short-circuited |
| | Off | | |
| Disconnected | On | Positive reflection wave | Disconnected |
| | Off | | |

| Case 1 | Result 1 | Result 2 | Assessment |
|---|---|---|---|
| 1 | Normal | Normal | Normal |
| 2 | Normal | Short-circuited | Short-circuited |
| 3 | Normal | Disconnected | Disconnected |
| 4 * | Normal | Undiagnosable | Undiagnosable |
| 5 | Short-circuited | Normal | Short-circuited |
| 6 | Short-circuited | Short-circuited | Short-circuited |
| 7 | Short-circuited | Disconnected | Short-circuited/Disconnected |
| 8 | Short-circuited | Undiagnosable | Short-circuited |
| 9 | Disconnected | Normal | Disconnected |
| 10 | Disconnected | Short-circuited | Short-circuited/Disconnected |
| 11 | Disconnected | Disconnected | Disconnected |
| 12 | Disconnected | Undiagnosable | Disconnected |
| 13 * | Undiagnosable | Normal | Undiagnosable |
| 14 | Undiagnosable | Short-circuited | Short-circuited |
| 15 | Undiagnosable | Disconnected | Disconnected |
| 16 * | Undiagnosable | Undiagnosable | Undiagnosable |

FIG.5

CABLE ABNORMALITY ASSESSMENT SYSTEM, SLAVE DEVICE, AND CABLE ABNORMALITY ASSESSMENT METHOD

CROSS-REFERENCE TO RELATED APPLICATION

This application is a 371 application of the International PCT application serial no. PCT/JP2021/004834, filed on Feb. 9, 2021, which claims the priority benefits of Japan Patent Application No. 2020-039396, filed on Mar. 6, 2020. The entirety of each of the above-mentioned patent applications is hereby incorporated by reference herein and made a part of this specification.

TECHNICAL FIELD

The invention relates to a cable abnormality assessment system, a slave device, and a cable abnormality assessment method.

RELATED ART

In the field of factory automation (FA), the control of various types of devices that share work processes is carried out. In order to operate various controllers, remote I/O, and manufacturing equipment used for work in a certain area such as factory facilities in cooperation with each other, an industrial network, also referred to as a field network, has been constructed to connect these devices.

In a general industrial network, a master-slave system consisting of various slave devices and a master device is adopted. A slave device is a device that controls equipment installed in a factory or collects data. A master device is a device that centrally manages these slave devices, for example, a device called PLC (Programmable Logical Controller).

EtherCAT (registered trademark) or Ethernet/IP is an example of such an industrial network approach (ETHERNET: registered trademark). In such an industrial network, a large number of communication cables are laid between each device to construct a network.

CITATION LIST

Patent Literature

[Patent Literature 1] Japanese Patent Publication "Japanese Patent Laid-Open No. 2013-236162"
[Patent Literature 2] Japanese Patent Publication "Japanese Patent Laid-Open No. 60-67808"

SUMMARY OF INVENTION

Technical Problem

If a disconnection or short circuit occurs in a cable between machines such as slave devices in an industrial network, communication between the machines is cut off. In the industrial network as described above, link-off information notifying the communication disruption between the machines may be notified from the slave device to the master device. Therefore, it is possible for the administrator to know through the master device that some kind of communication abnormality has occurred between specific slave devices. However, it is impossible to know whether or not the communication disruption is caused by a cable failure. Also, it is not possible to know where the fault is located on the cable.

On the other hand, Patent Literature 1 discloses a communication terminal having a function of judging the presence or absence of a cable failure. Further, Patent Literature 2 discloses a technique of calculating a distance to a cable disconnection location by detecting a reflection wave of a diagnostic pulse introduced from an end of the cable. However, the industrial network is an important system responsible for the operation of the factory, and it is difficult to stop it unnecessarily for abnormality diagnosis of the cable.

Even if the technique of detecting cable abnormality by detecting the reflection wave of the diagnostic pulse is applied to the above industrial network, there is a problem that cable diagnosis may not be performed due to the fact that the system of the industrial network cannot be easily stopped. The invention has been made in view of the above problems, and an object of the invention is to realize a cable abnormality assessment system that enables cable abnormality to be detected in a network irrespective of the operating status of another machine to which the cable is connected.

Solution to Problem

The invention adopts following configuration in order to solve the above-mentioned problems. The cable abnormality assessment system according to one aspect of the invention has a configuration including a communication unit provided in a slave device controlled by a master device, and a diagnosis control unit. The communication unit includes a signal line diagnosis unit that performs, by transmitting a pulse to a pair signal line of a cable connected and detecting a reflection wave, an abnormality diagnosis of the pair signal line. The diagnosis control unit performs an abnormality assessment of the cable based on: link-up information on whether or not there is a link-up between the communication unit and an another machine connected to the other end of the cable; first information that is an abnormality diagnosis result by the signal line diagnosis unit for one pair signal line of two pair signal lines of the cable; and second information that is an abnormality diagnosis result by the signal line diagnosis unit for the other pair signal line of the two pair signal lines of the cable.

The slave device according to one aspect of the invention has a configuration including a slave device controlled by a master device, a communication unit, and a diagnosis control unit. The communication unit includes a signal line diagnosis unit that performs, by transmitting a pulse to a pair signal line of a cable connected and detecting a reflection wave, an abnormality diagnosis of the pair signal line. The diagnosis control unit performs an abnormality assessment of the cable based on: link-up information on whether or not there is a link-up between the communication unit and an another machine connected to the other end of the cable; first information that is an abnormality diagnosis result by the signal line diagnosis unit for one pair signal line of two pair signal lines of the cable; and second information that is an abnormality diagnosis result by the signal line diagnosis unit for the other pair signal line of the two pair signal lines of the cable.

The cable abnormality assessment method according to one aspect of the invention has a configuration including using a signal line diagnosis that performs, by transmitting a pulse to a pair signal line of a cable and detecting a reflection wave, an abnormality diagnosis of the pair signal line. An abnormality assessment of the cable is performed based on: link-up information on whether or not there is a link-up through the cable; first information that is an abnormality diagnosis result using the signal line diagnosis for one pair signal line of two pair signal lines of the cable; and second information that is an abnormality diagnosis result using the signal line diagnosis for the other pair signal line of the two pair signal lines of the cable.

Effects of Invention

According to the cable abnormality assessment system or the cable abnormality assessment method according to one aspect of the invention, it is possible to realize a cable abnormality assessment system that enables cable abnormality to be detected in a network irrespective of the operating status of another machine to which the cable is connected.

According to the slave device according to one aspect of the invention, it is possible to realize a slave device that enables cable abnormality to be detected in a network irrespective of the operating status of another machine to which the cable is connected.

BRIEF DESCRIPTION OF DRAWINGS

FIG. 5 shows an assessment table used by the cable abnormality assessment system according to embodiment 1 of the invention in cable abnormality assessment.

DESCRIPTION OF EMBODIMENTS

Embodiment

Hereinafter, embodiments according to one aspect of the invention (hereinafter, also referred to as "the present embodiment") will be described with reference to the drawings.

§ 1 Application Example

Figure 1:
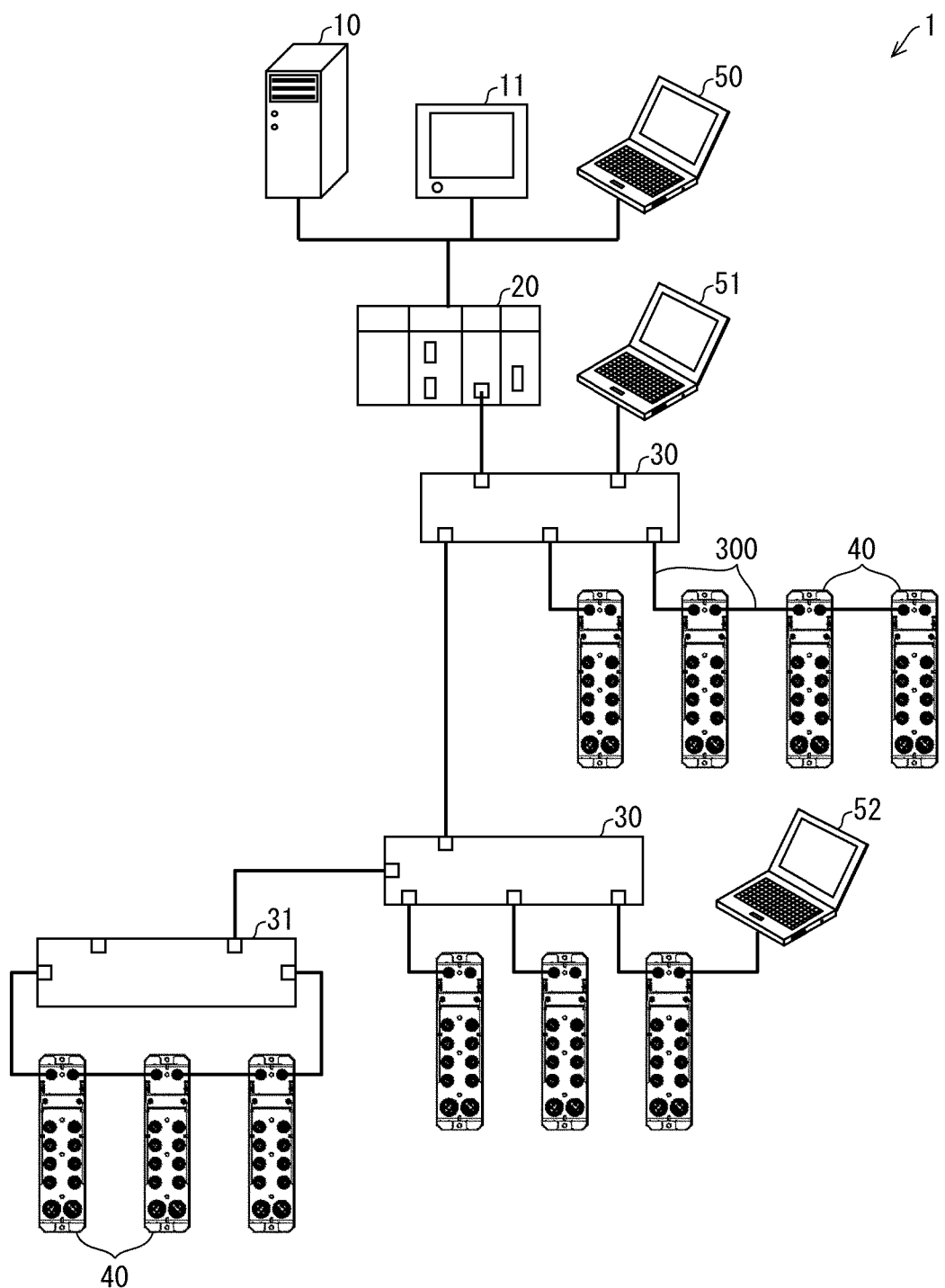
FIG. 1 is a diagram showing a network to which a cable abnormality assessment system according to embodiment 1 of the invention is applied.

First, an example of a situation in which the invention is applied will be described. FIG. 1 is a schematic configuration diagram showing an industrial network 1 in a production factory or the like to which a cable abnormality assessment system according to this application example is applied. The industrial network 1 includes a master device 20 and a plurality of slave devices 40. Each of the slave devices 40 is controlled by the master device 20 through the industrial network 1 to construct various required processes in a production factory or the like.

The slave device 40 is provided with a communication unit (not shown in FIG. 1), and is connected to another machine via a cable 300. Further, in the industrial network 1, a diagnosis control unit (not shown in FIG. 1) is provided. The diagnosis control unit may be provided in the slave device 40, but may be provided in another machine.

The cable 300 has a plurality of pair signal lines inside. Communication machines in the industrial network 1 including the master device 20 and the plurality of slave devices 40 communicate with each other using two pair signal lines. The communication unit of the slave device 40 has a signal line diagnosis unit that performs an abnormality diagnosis of the pair signal line by transmitting a pulse to the pair signal line used for communication of the connected cable 300 and detecting a reflection wave.

The diagnosis control unit executes abnormality assessment of the cable 300 based on the following information (1)-(3): (1) Link-up information as to whether or not there is a link-up between the communication unit and another machine connected to the other end of the cable 300; (2) First information which is an abnormality diagnosis result by the signal line diagnosis unit for one pair signal line of two pair signal lines of the cable 300; and (3) Second information which is an abnormality diagnosis result by the signal line diagnosis unit for the other pair signal line of the two pair signal lines of the cable 300.

In the cable abnormality assessment system according to this application example, the abnormality assessment of the cable 300 is executed based on the information of the above (1)-(3). As a result, it is possible to avoid a state in which it cannot be assessed whether the result of the assessment for the cable 300 is normal or abnormal, regardless of the operating status of the another machine connected to the other end of the cable 300. Therefore, according to the cable abnormality assessment system according to the present application example, it is possible to realize a cable abnormality assessment system that enables cable abnormality to be detected in a network irrespective of the operating status of another machine to which the cable is connected.

§ 2 Configuration Example

<Industrial Network>

The industrial network 1 to which a cable abnormality assessment system 100 according to the embodiment is applied will be described in more detail with reference to FIG. 1. The industrial network 1 includes the master device 20 and a plurality of slave devices 40. As a specific example, EtherCAT (registered trademark) or Ethernet/IP is applied to the industrial network 1 (ETHERNET: registered trademark, Ethernet: registered trademark).

A programmable logic controller may be applied to the master device 20. The slave device 40 managed or controlled by the master device 20 is appropriately linked to the master device 20 via a hub 30 or a ring supervisor 31. The hub 30 is a communication device that branches a communication path from the master device side (upstream side). The ring supervisor 31 is a communication device linked to the master device 20 and forming a ring network with a plurality of slave devices 40 under its control.

Each device of the master device 20, the hub 30, the ring supervisor 31, and the slave device 40 is connected by a communication cable 300 generally called a LAN cable (Local Area Network Cable). As shown in the diagram, the slave device 40 may be further linked to another slave device (another machine) by the cable 300 connected not only to a master side but also to the opposite side (downstream side).

A server 10, which is a higher-level information processing system, may be linked to the master device 20. For the link between the master device 20 and the server 10, a communication network system such as Ethernet (registered trademark) or Ethernet/IP may be applied as an example. Similarly, a display device 11 may be linked to the master device 20. The display device 11 may further include an input means such as a touch panel such that instructions may be input to the master device 20.

Further, a control computer 50, which is also referred to as a tool, may be linked to the master device 20 in the same manner. For the link between the master device 20 and the display device 11, or the link between the master device 20 and the control computer 50, another method such as a connection by USB (Universal Serial Bus) may be used.

Further, a control computer 51, also referred to as a tool, may be connected to the hub 30 by the cable 300. Alternatively, a control computer 52, also referred to as a tool, may be connected to the slave device 40 by the cable 300.

<Cable Abnormality Assessment System>

Figure 2:
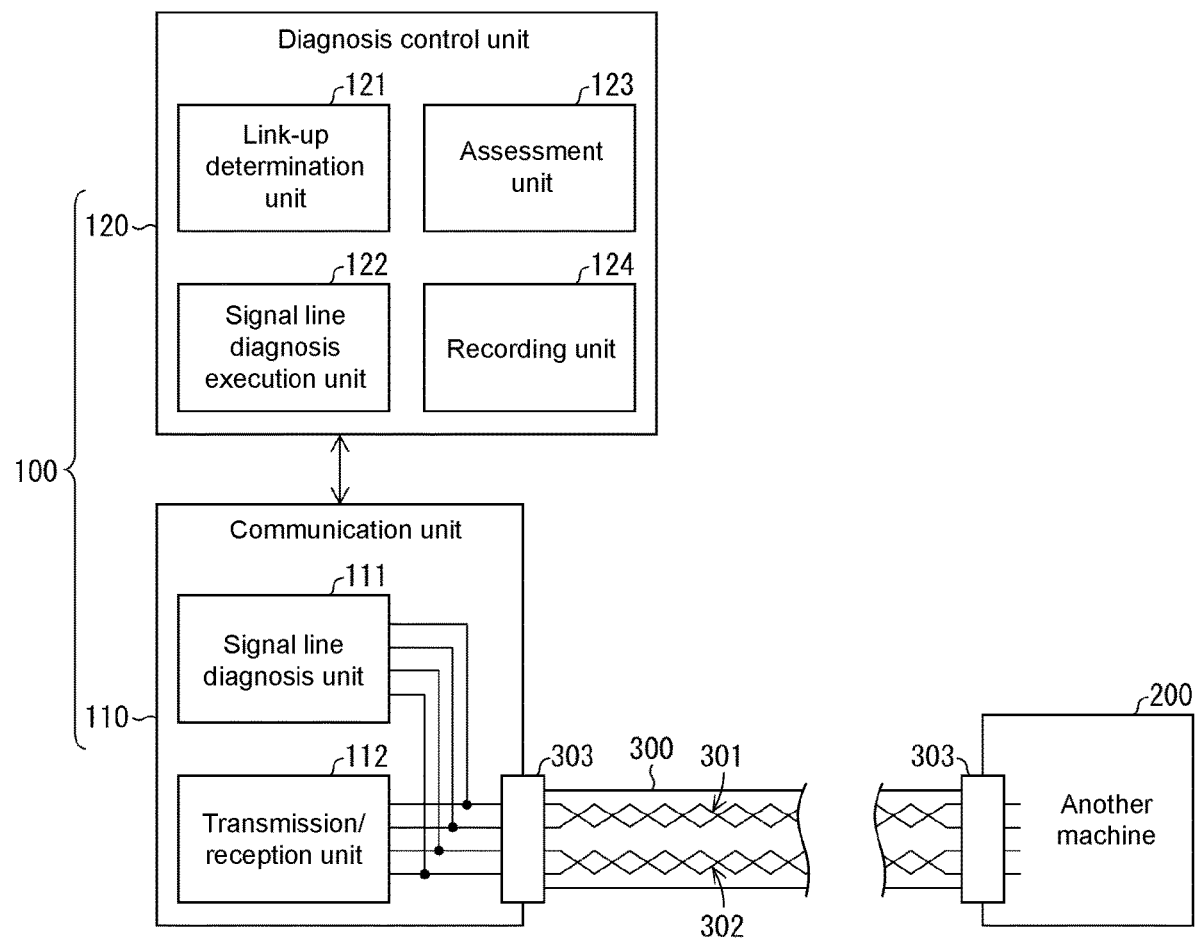
FIG. 2 is a block diagram showing a cable abnormality assessment system according to embodiment 1 of the invention.

FIG. 2 is a block diagram showing a configuration of the cable abnormality assessment system 100 according to the embodiment. The cable abnormality assessment system 100 according to the embodiment includes a communication unit 110 and a diagnosis control unit 120. The communication unit 110 is provided in the slave device 40. When the slave device 40 is a slave device constituting a ring network, or a slave device capable of connecting another communication device such as a slave device to the downstream side, the slave device 40 may be provided with a plurality of communication units 110.

The cable 300 is connected to the communication unit 110. A plug 303 is provided at an end of the cable 300, and is connected to and fixed to a jack of the communication unit 110. The plug and jack may conform to the RJ45 standard, but are not limited to such type. The cable 300 has two pair signal lines, a pair signal line 301 and a pair signal line 302. The other end of the cable 300 is connected to another machine 200. The another machine 200 may be one of the slave devices 40 in FIG. 1. Alternatively, the another machine 200 may be a slave device in which a signal line diagnosis unit 111 is not provided.

The communication unit 110 has the signal line diagnosis unit 111 and a transmission/reception unit 112. The signal line diagnosis unit 111 and the transmission/reception unit 112 are respectively connected to the pair signal line 301 and the pair signal line 302 of the cable 300. The transmission/reception unit 112 communicates with the another machine connected to the opposite side of the cable 300 by using one of the pair signal line 301 and the pair signal line 302 as a signal pair for transmission and the other thereof as a signal pair for reception. The signal line diagnosis unit 111 selects either the pair signal line 301 or the pair signal line 302 and performs the abnormality diagnosis. Details of the abnormality diagnosis of the pair signal line will be described later.

The diagnosis control unit 120 has functional blocks of a link-up determination unit 121, a signal line diagnosis execution unit 122, an assessment unit 123, and a recording unit 124. The functions and operations of these functional blocks will be described later. The diagnosis control unit 120 is provided in any one of the slave device 40, the control computer 50, the control computer 51, and the control computer 52.

When the diagnosis control unit 120 is provided in the slave device 40, the slave device 40 independently constitutes the cable abnormality assessment system 100 according to the embodiment. When the diagnosis control unit 120 is provided in the control computer 50, the cable abnormality assessment system 100 is configured by the slave device 40 linked to the control computer 50, and the control computer 50. In this case, the control computer 50 realizes the function of the diagnosis control unit 120 by executing a predetermined program.

Also when the diagnosis control unit 120 is provided in the control computer 51 or when the diagnosis control unit 120 is provided in the control computer 52, this is the same as the case where the diagnosis control unit 120 is provided in the control computer 50.

<Abnormality Diagnosis of Pair Signal Line>

The abnormality diagnosis of the pair signal line of the cable 300 by the signal line diagnosis unit 111 will be described. The signal line diagnosis unit 111 selects one pair signal line of the connected cable 300 and executes an abnormality diagnosis based on a known principle using a diagnostic pulse. Here, a case where the pair signal line 301 is selected will be briefly described as an example.

The signal line diagnosis unit 111 sends out the diagnostic pulses, which is an isolated pulse, to the pair signal line 301. Then, the pulse reflected and returned at an abnormal location of the pair signal line 301 is detected as a reception wave. The diagnostic unit analyzes a shape of this reflection wave and sets the diagnosis result as "disconnected" or "short-circuited".

A time difference between the diagnostic pulse and the returned pulse corresponds to a round-trip distance from a connection end with the signal line diagnosis unit 111 to the abnormal location of the pair signal line 301. The signal line diagnosis unit 111 calculates the distance from the connection end with the signal line diagnosis unit 111 to the abnormal location of the pair signal line 301 based on such a time difference. That is, when the diagnosis result is "disconnected" or "short-circuited", the distance to the abnormal location is also calculated.

When the pair signal line 301 is disconnected or short-circuited, the above diagnosis result is not affected by a conduction state of the another machine 200 to which the cable 300 is connected. This is because communication is disrupted at the abnormal location. Therefore, the above diagnosis result does not change irrespective of whether the power of the another machine 200 is on or off.

When the pair signal line 301 is normal, the relationship with the another machine 200 through the cable 300 is not disrupted. When the another machine 200 is on, the signal line diagnosis unit 111 receives a fast link pulse for communication from the another machine 200 one after another even at the time of abnormality diagnosis. The signal line diagnosis unit 111 cannot judge the reflection wave, and sets the diagnosis result as "undiagnosable".

On the other hand, when the another machine 200 is off, the other end of the pair signal line 301 is terminated, and the reflection wave of the diagnostic pulse does not return. At this time, the signal line diagnosis unit 111 sets the diagnosis result to "normal". The diagnosis results in each of the above cases by the signal line diagnosis unit 111 are summarized in a table in FIG. 3.

<Operation of Cable Abnormality Assessment System>

As described above, the diagnosis result of the pair signal line by the signal line diagnosis unit 111 includes "undiagnosable". Therefore, if the cable abnormality is assessed simply based on the pair signal line abnormality diagnosis by the signal line diagnosis unit 111, the result of the cable abnormality assessment may not be confirmed whether it is normal or not.

However, in the cable abnormality assessment system 100 according to the embodiment, such an uncertain situation is avoided. Hereinafter, the characteristic operation of the cable abnormality assessment executed by the cable abnormality assessment system 100 will be described with reference to the flowchart of FIG. 4.

Step S1: At a beginning of the flow, the link-up determination unit 121 receives link-up information from the transmission/reception unit 112 of the communication unit 110, which is information about establishment of a link for communication with the another machine 200 through the cable 300, that is, link-up. Then, the link-up determination unit 121 determines whether or not the communication unit 110 is linked up with the another machine 200. If it is determined that there is no link-up (YES in S1), the flow proceeds to step S2. In other cases (NO in S1), the flow proceeds to step S4.

Step S2: The signal line diagnosis execution unit 122 instructs the signal line diagnosis unit 111 to select the pair signal line 301 by the signal line diagnosis unit 111 and execute the abnormality diagnosis. Then, the signal line diagnosis execution unit 122 obtains a result 1 (first information) which is the diagnosis result for the pair signal line 301 from the signal line diagnosis unit 111.

Step S3: Subsequently, the signal line diagnosis execution unit 122 instructs the signal line diagnosis unit 111 to select the pair signal line 302 by the signal line diagnosis unit 111 and execute the abnormality diagnosis. Then, the signal line diagnosis execution unit 122 obtains a result 2 (second information) which is the diagnosis result for the pair signal line 302 from the signal line diagnosis unit 111. Next, the flow proceeds to step S5.

Step S4: The assessment unit 123 sets the result 1 as "normal" and the result 2 as "normal". This is because when there is link-up by the transmission/reception unit 112, it is determined that there is no abnormality in both the pair signal line 301 and the pair signal line 302 of the cable 300. Next, the flow proceeds to step S5.

Step S5: The assessment unit 123 calculates a result of the assessment for a combination of the result 1 and the result 2 according to an assessment table held by the recording unit 124. If the result of the assessment includes "short-circuited" or "disconnected", the result of the assessment may be set to include the distance to the abnormal location. Then the flow ends.

The diagnosis control unit 120 appropriately holds the result of the assessment obtained by the above flow in the recording unit 124. Alternatively, the diagnosis control unit 120 may notify the master device 20, the server 10, and another machines of the result of the assessment obtained by the above flow.

FIG. 5 shows the contents of the assessment table held by the recording unit 124. When both the result 1 and the result 2 of a case 1 are "normal", the result of the cable abnormality assessment is "normal". This is because both of the pair signal lines 301 and 302 are normal and there is no abnormality in the cable 300.

If at least one of the result 1 or the result 2 of cases 2, 3, 5-12, 14, and 15 is "short-circuited" or "disconnected", the result of the cable abnormality assessment is "short-circuited" or "disconnected". This is because the signal line diagnosis execution unit 122 has found an abnormality of "short-circuited" or "disconnected" in at least one of the pair signal lines.

Of these, when the content of the abnormality is divided into "short-circuited" and "disconnected" in the result 1 and the result 2 (cases 7 and 10), either one of the results may be adopted as the result of the cable abnormality assessment. In selecting one, the distance to the abnormal location may be taken into consideration. Alternatively, the results of "short-circuited" and "disconnected" may be adopted.

In cases 4 and 13, when one of the results 1 or 2 is "normal" and the other is "undiagnosable", or when both the result 1 and the result 2 of the case 16 are "undiagnosable", the result of the cable abnormality assessment is "undiagnosable".

Figures 3, 4:
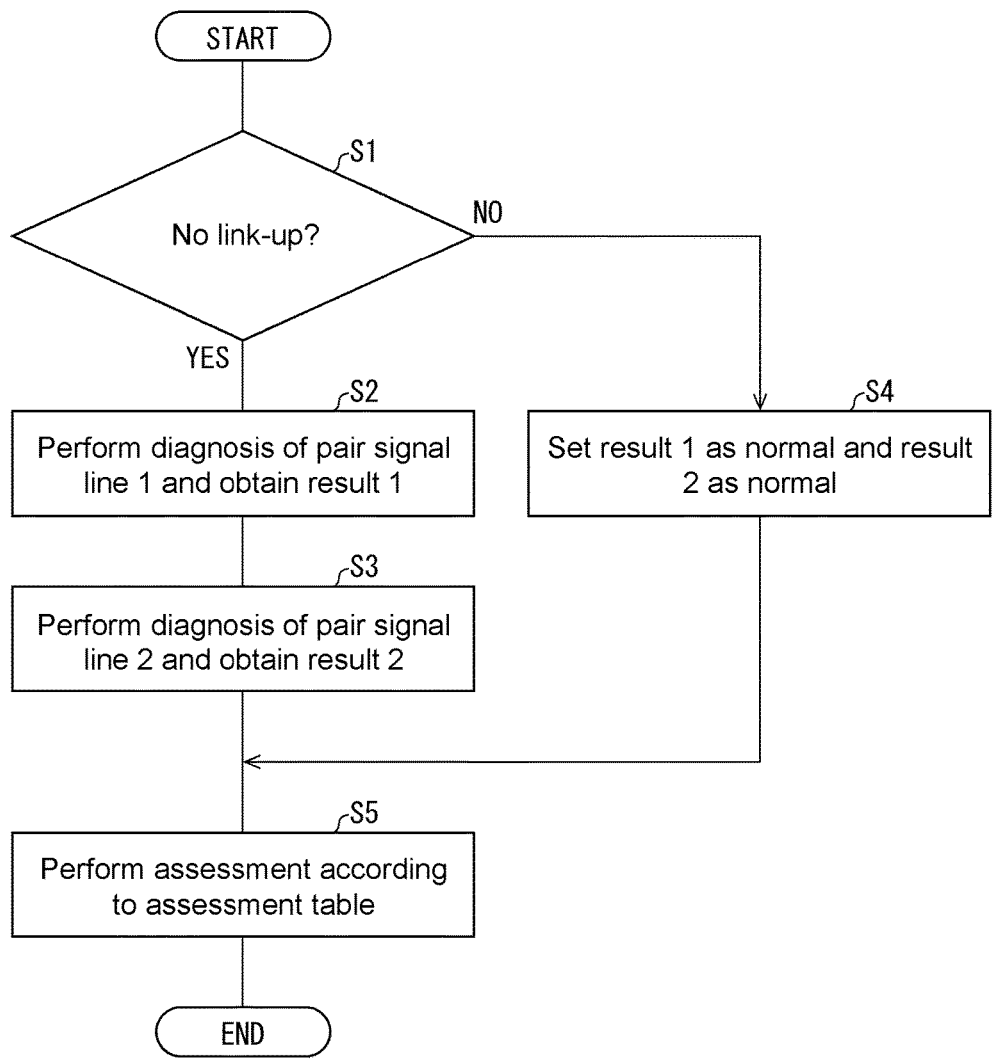
FIG. 3 is a table showing diagnosis results of signal line diagnosis executed by a signal line diagnosis unit of the cable abnormality assessment system according to embodiment 1 of the invention for each case.
FIG. 4 is a flowchart for explaining a cable abnormality assessment executed by the cable abnormality assessment system according to embodiment 1 of the invention.

However, as shown in FIG. 3, the abnormality diagnosis result of the pair signal line becomes "undiagnosable" when the pair signal line is normal. If both the pair signal lines 301 and 302 are normal, the slave device is linked up by the transmission/reception unit 112, therefore in step S4, both the result 1 and the result 2 should be forcibly set as "normal". Then, the result of the cable abnormality assessment based on the assessment table should be "normal".

Therefore, in the cable abnormality assessment system 100 that performs an assessment according to the above-mentioned flow shown in FIG. 4, it is essentially impossible that the result of the cable abnormality assessment in cases 4, 13, and 16 is "undiagnosable". In FIG. 5, such essentially impossible cases are marked with (*). Only when such an essentially impossible case occurs, the assessment unit 123 sets the result of the cable abnormality assessment as "undiagnosable".

As a possibility that such a case may occur, it is conceivable that the signal line diagnosis unit 111 makes an error in the abnormality diagnosis of the pair signal line. However, this is a very unlikely event, and in the cable abnormality assessment system 100, it is practically avoided that the result of the cable abnormality assessment is not confirmed whether it is normal or not.

According to the cable abnormality assessment system 100 according to the embodiment, abnormality assessment of the cable 300 using the signal line diagnosis unit 111 included in the slave device 40 may be realized in the industrial network 1. Therefore, the administrator of the industrial network 1 can easily confirm the presence or absence of a cable abnormality. Moreover, when there is an abnormality in the cable 300, the abnormal location is specified as the distance from the slave device 40 constituting the cable abnormality assessment system 100.

Furthermore, since the abnormal location is uniquely identified, the administrator can easily know where in the factory the cable abnormality occurred. There are various situations in the factory where there is a risk of damaging the cable, for example, as follows: when a cable is provided along a moving part such as a robot arm or a moving stage, and exercise causes stress; when the cable is disposed in a location subject to vibration or pressure; when the cable is installed in a location exposed to temperature changes; when the cable is exposed to sparks or high or low temperatures; and when the cable is exposed to chemical substances such as chemical agents and gases.

If it is found that a failure has occurred at a specific position on the cable, the administrator can easily find out which of these factors causing the cable abnormality in the factory actually caused the failure. Therefore, it becomes easy to take measures so as not to cause the same failure next time.

Moreover, in the cable abnormality assessment system 100, it is not necessary for the network administrator to stop the operation by turning off the power of the machine connected to the other end of the cable 300, in order to perform the abnormality assessment of the connected cable 300 from the specific slave device 40. In the industrial network 1, the number of cables 300 and the number of slave devices 40 are enormous, and it is very complicated to specify the machine and turn off the power at a site.

Therefore, even if the operation of machine is stopped for the entire industrial network 1 or in a certain range of areas, since the industrial network is an important system responsible for the operation of the factory, it is not desirable to stop it unnecessarily for the diagnosis of cable abnormality. However, in the cable abnormality assessment system 100, since the cable abnormality assessment may be performed without turning off the power of the machine connected to the other end of the cable 300, and the result is fixed, its usefulness in managing the industrial network 1 is very large.

Further, in the ring network configured by using, for example, the ring supervisor 31 in the industrial network 1 as shown in FIG. 1, the following effects are also obtained. The ring network is a topology having redundancy such that even if an abnormality occurs in a specific cable 300 in the ring network, the constituent machines including the machines at both ends may maintain communication.

Conventionally, in order to correctly diagnose the cable 300 connected from the slave device 40, which is a machine in the ring network, it is necessary to turn off the power of another machine connected to the cable 300. However, such an operation is complicated and impairs the above-mentioned advantages of configuring the ring network. According to the cable abnormality assessment system 100 according to the embodiment, the cable abnormality assessment may be performed while maintaining the merit of the ring network that does not stop the constituent machines.

Realization Example

Functional blocks of the diagnosis control unit 120 (particularly, the link-up determination unit 121, the signal line diagnosis execution unit 122, the assessment unit 123) may be realized by a logic circuit (hardware) formed in an integrated circuit (IC chip) or the like, or may be realized by software.

In the latter case, the control device includes a computer that executes instructions of a program that is software that realizes each function. The computer includes, for example, one or more processors and a computer-readable recording medium that stores the program. Then, in the computer, the processor reads the program from the recording medium and executes it, thereby achieving the object of the invention.

As the processor, for example, a CPU (Central Processing Unit) may be used. As the recording medium, a "non-temporary tangible medium", for example, a ROM (Read Only Memory) or the like, a tape, a disk, a card, a semiconductor memory, a programmable logic circuit, or the like may be used.

Moreover, a RAM (Random Access Memory) for developing the above program may be further provided. Further, the program may be supplied to the computer via any transmission medium (communication network, broadcast wave, etc.) capable of transmitting the program. It should be noted that one aspect of the invention may also be realized in the form of a data signal embedded in a carrier wave, in which the above program is embodied by electronic transmission.

(Summary)

The invention adopts following configuration in order to solve the above-mentioned problems. The cable abnormality assessment system according to one aspect of the invention has a configuration including a communication unit provided in a slave device controlled by a master device, and a diagnosis control unit. The communication unit includes a signal line diagnosis unit that performs, by transmitting a pulse to a pair signal line of a cable connected and detecting a reflection wave, an abnormality diagnosis of the pair signal line. The diagnosis control unit performs an abnormality assessment of the cable based on: link-up information on whether or not there is a link-up between the communication unit and an another machine connected to the other end of the cable; first information that is an abnormality diagnosis result by the signal line diagnosis unit for one pair signal line of two pair signal lines of the cable; and second information that is an abnormality diagnosis result by the signal line diagnosis unit for the other pair signal line of the two pair signal lines of the cable.

According to the above configuration, it is possible to realize a cable abnormality assessment system that enables cable abnormality to be detected in a network irrespective of the operating status of another machine to which the cable is connected.

In the cable abnormality assessment system according to the one aspect, the diagnosis control unit may have a configuration in which the cable is assessed to be normal when the link-up information is information that there is link-up. According to the above configuration, in the detection of the cable abnormality in the network, it is possible to avoid the conclusion of the assessment from being unclear, and when the cable is normal, it is possible to obtain the conclusion that it is normal.

In the cable abnormality assessment system according to the above one aspect, the diagnosis control unit may have a configuration for assessing that the cable is disconnected or short-circuited when at least one of the first information or the second information is disconnected or short-circuited. According to the above configuration, in the detection of the cable abnormality in the network, it is possible to avoid the conclusion of the assessment from being unclear, and when the cable is disconnected or short-circuited, it is possible to obtain the conclusion that the cable is disconnected or short-circuited.

In the cable abnormality assessment system according to the above one aspect, the abnormality diagnosis result by the signal line diagnosis unit may be configured to be normal, short-circuited, disconnected, or undiagnosable. According to the above configuration, it is possible to more specifically configure a cable abnormality assessment system that enables cable abnormality to be detected in a network irrespective of the operating status of another machine to which the cable is connected.

In the cable abnormality assessment system according to the above one aspect, the diagnosis control unit may be provided in the slave device. According to the above configuration, a slave device capable of independently executing the above abnormality assessment can be realized.

In the cable abnormality assessment system according to the one aspect, the slave device and the control computer may be configured, and the diagnosis control unit may be provided in the control computer. According to the above configuration, it is possible to realize a cable abnormality assessment system capable of performing abnormality assessment of a cable connected to the slave device by linking with the selected slave device in the network.

The slave device according to one aspect of the invention has a configuration including a slave device controlled by a master device, a communication unit, and a diagnosis control unit. The communication unit includes a signal line diagnosis unit that performs, by transmitting a pulse to a pair signal line of a cable connected and detecting a reflection wave, an abnormality diagnosis of the pair signal line. The diagnosis control unit performs an abnormality assessment of the cable based on: link-up information on whether or not there is a link-up between the communication unit and an another machine connected to the other end of the cable; first information that is an abnormality diagnosis result by the signal line diagnosis unit for one pair signal line of two pair signal lines of the cable; and second information that is an abnormality diagnosis result by the signal line diagnosis unit for the other pair signal line of the two pair signal lines of the cable.

According to the above configuration, it is possible to realize a slave device that enables cable abnormality to be detected in a network irrespective of the operating status of another machine to which the cable is connected.

The cable abnormality assessment method according to one aspect of the invention has a configuration including using a signal line diagnosis that performs, by transmitting a pulse to a pair signal line of a cable and detecting a reflection wave, an abnormality diagnosis of the pair signal line. An abnormality assessment of the cable is performed based on: link-up information on whether or not there is a link-up through the cable; first information that is an abnormality diagnosis result using the signal line diagnosis for one pair signal line of two pair signal lines of the cable; and second information that is an abnormality diagnosis result using the signal line diagnosis for the other pair signal line of the two pair signal lines of the cable.

According to the above configuration, it is possible to realize a cable abnormality assessment system that enables cable abnormality to be detected in a network irrespective of the operating status of another machine to which the cable is connected.

The invention is not limited to the above-described embodiments and examples, and various modifications may be made within the scope of the claims. The technical scope of the invention also includes embodiments obtained by appropriately combining different technical means disclosed in the different embodiments and examples.

What is claimed is:

1. A cable abnormality assessment system, comprising:
    a communication unit provided in a slave device controlled by a master device; and
    a diagnosis control unit,
    wherein the communication unit comprises a signal line diagnosis unit that performs, by transmitting a pulse to a pair signal line of a cable connected and detecting a reflection wave, an abnormality diagnosis of the pair signal line, and
    the diagnosis control unit performs an abnormality assessment of the cable based on:
        link-up information on whether or not there is a link-up between the communication unit and an another machine connected to the other end of the cable;
        first information that is an abnormality diagnosis result by the signal line diagnosis unit for one pair signal line of two pair signal lines of the cable; and
        second information that is an abnormality diagnosis result by the signal line diagnosis unit for the other pair signal line of the two pair signal lines of the cable,
    if the link up information is information indicating that there is a link-up between the communication unit and the another machine, the diagnosis control unit determines that the cable is normal,
    if the link-up information is information indicating that there is not a link-up between the communication unit and the another machine, the signal line diagnosis unit performs the abnormality diagnosis for the one pair signal line and the abnormality diagnosis for the other pair of signal line, and if at least either the first information or the second information is disconnected or short-circuited, the diagnosis control unit determines that the cable is disconnected or short-circuited, and determines that the cable is normal if both the first information and the second information are normal.

2. The cable abnormality assessment system according to claim 1, wherein the abnormality diagnosis result by the signal line diagnosis unit is any of normal, short-circuited, disconnected, and undiagnosable.

3. The cable abnormality assessment system according to claim 2, wherein the diagnosis control unit is provided in the slave device.

4. The cable abnormality assessment system according to claim 2, composed of the slave device and a control computer, wherein the diagnosis control unit is provided in the control computer.

5. The cable abnormality assessment system according to claim 1, wherein the diagnosis control unit is provided in the slave device.

6. The cable abnormality assessment system according to claim 1, composed of the slave device and a control computer, wherein the diagnosis control unit is provided in the control computer.

7. A slave device controlled by a master device, the slave device comprising:
    a communication unit; and
    a diagnosis control unit,
    wherein the communication unit comprises a signal line diagnosis unit that performs, by transmitting a pulse to a pair signal line of a cable connected and detecting a reflection wave, an abnormality diagnosis of the pair signal line, and
    the diagnosis control unit performs an abnormality assessment of the cable based on:
        link-up information on whether or not there is a link-up between the communication unit and an another machine connected to the other end of the cable;
        first information that is an abnormality diagnosis result by the signal line diagnosis unit for one pair signal line of two pair signal lines of the cable; and
        second information that is an abnormality diagnosis result by the signal line diagnosis unit for the other pair signal line of the two pair signal lines of the cable,
    if the link up information is information indicating that there is a link-up between the communication unit and the another machine, the diagnosis control unit determines that the cable is normal,
    if the link-up information is information indicating that there is not a link-up between the communication unit and the another machine, the signal line diagnosis unit performs the abnormality diagnosis for the one pair signal line and the abnormality diagnosis for the other pair of signal line, and if at least either the first information or the second information is disconnected or short-circuited, the diagnosis control unit determines that the cable is disconnected or short-circuited, and determines that the cable is normal if both the first information and the second information are normal.

8. A cable abnormality assessment method, using a signal line diagnosis that performs, by transmitting a pulse to a pair signal line of a cable and detecting a reflection wave, an abnormality diagnosis of the pair signal line,
    wherein the cable abnormality assessment method comprising:

a step to obtain a link-up information on whether or not there is a link-up through the cable;

a first step to determine that the cable is normal when the link-up information is information that there is link-up; and a second step to determine the cable when the link-up information is information that there is no link-up, the second step comprises:

a sub-step to execute the signal line diagnosis for one pair signal line of two pair signal lines of the cable and obtain a first information that is an abnormality diagnosis result;

a sub-step to execute the signal line diagnosis for the other pair signal line of the two pair signal lines of the cable and obtain a second information that is an abnormality diagnosis result, and a sub-step to determine that the cable is disconnected or short-circuited if at least either the first information or the second information is disconnected or short-circuited, and determine that the cable is normal if both the first information and the second information are normal.

* * * * *